United States Patent [19]
Pulvirenti et al.

[11] Patent Number: 5,668,508
[45] Date of Patent: Sep. 16, 1997

[54] OSCILLATOR CIRCUIT HAVING OSCILLATION FREQUENCY INDEPENDENT FROM THE SUPPLY VOLTAGE VALUE

[75] Inventors: Francesco Pulvirenti, Acireale; Riccardo Ursino, Catania; Roberto Gariboldi, Lacchiarella, all of Italy

[73] Assignees: Co.Ri.M.Me - Consorzio per la Ricerca sulla Microelettronica nel Mezzogiorno, Catania; SGS-Thomson Microelectronics S.r.l., Agrate Brianza, both of Italy

[21] Appl. No.: 623,613

[22] Filed: Mar. 29, 1996

[30] Foreign Application Priority Data

Mar. 31, 1995 [EP] European Pat. Off. ............ 95830123

[51] Int. Cl.⁶ ........................................... H03K 3/0231
[52] U.S. Cl. .......................... 331/111; 331/143; 331/175
[58] Field of Search .................................. 331/111, 143, 331/175

[56] References Cited

U.S. PATENT DOCUMENTS

| | | | |
|---|---|---|---|
| 4,594,565 | 6/1986 | Barreras | 331/108 A |
| 4,983,931 | 1/1991 | Nakano | 331/111 |
| 5,070,311 | 12/1991 | Nicolai | 331/111 |
| 5,250,914 | 10/1993 | Kondo | 331/111 |

FOREIGN PATENT DOCUMENTS

| | | |
|---|---|---|
| 0 231 872 | 8/1987 | European Pat. Off. . |
| 59-165516 | 9/1984 | Japan . |

OTHER PUBLICATIONS

Hobrecht, Stephen, "An Intelligent BiCMOS/DMOS Quad 1-A High-Side Switch", IEEE Journal of Solid-State Circuits 25(6):1395-1402, Dec., 1990.

*Primary Examiner*—Siegfried H. Grimm
*Attorney, Agent, or Firm*—David V. Carlson; Seed and Berry LLP

[57] ABSTRACT

An oscillating circuit including a capacitor, a charge circuitry and a control circuitry. The charge circuitry includes first and second current generators having respectively first and second current values that are opposite in direction and a switching circuit designed to couple alternately the generators to the capacitor. The control circuitry has a voltage input coupled to the capacitor and an output coupled to control inputs of the switching circuit and includes a comparator with hysteresis having a lower threshold and an upper threshold. The difference between the upper threshold and the lower threshold is chosen to be substantially proportional to the ratio of the product to the sum of the two current values such that the oscillation frequency and the duty cycle do not depend on the supply voltage, the temperature and the process.

24 Claims, 3 Drawing Sheets

OSCILLATOR CIRCUIT HAVING OSCILLATION FREQUENCY INDEPENDENT FROM THE SUPPLY VOLTAGE VALUE

TECHNICAL FIELD

The present invention relates to a method for generating an oscillating electric signal and associated oscillating circuit.

BACKGROUND OF THE INVENTION

Oscillators are widely used in analog and digital circuits. They can be employed in a large number of applications, for example to drive a voltage multiplier, generate a clock frequency or create a programmable delay. Usually a well-designed oscillator should be able to operate at high switching frequency, have an oscillation frequency independent of the supply voltage and variations in process and temperature, have a duty cycle definable in accordance with a constant ratio and have low electromagnetic interference (EMI), i.e., primarily voltage edges with controlled and not too high slope.

A very simple oscillating circuit can be achieved by connecting in a loop two inverters, one resistor and one capacitor and generating an oscillating electric signal having an essentially square shape. Naturally this simple circuit does not meet the above mentioned requisites and in particular the oscillation frequency depends both on the supply voltage and the switching threshold of the inverters and hence on the temperature and the process.

From the article by S. Hobrecht, "An Intelligent BiCMOS/DMOS Quad 1-A High-Side Switch", IEEE Journal of Solid-State Circuits, Vol. 25, No. 6, December 1990, and incorporated herein by reference, and in particular FIG. 4 and the corresponding description on page 1397, a more sophisticated circuit is known and shown in the annexed FIG. 1.

It comprises a first inverter INV1, a second inverter INV2 and two symmetrical and analogous sections, the first of which comprises a first capacitor C1 having a first and a second terminals, a first current generator GEN1 having an input terminal and an output terminal, a first transistor SW1 of the p-channel MOS type and a first controlled switch SW3. Analogously the second section comprises a second capacitor C2 having a first and a second terminal, a second current generator GEN2 having an input terminal and an output terminal, a second transistor SW2 of n-channel MOS type and a second controlled switch SW4.

The circuit is powered by means of connection to a ground terminal GND and a power supply terminal VS. The output terminal OUT is connected to the output of the inverter INV2.

If the two capacitors have the same capacitance Co and the generators GEN1 and GEN2 have the same current Io, oscillation frequency will be:

$$f_0 = \frac{I_0}{VS \cdot C_0}$$

and hence depends on the supply voltage; the duty cycle depends on the switching threshold of the inverters (and hence on the temperature and process); and in addition, despite the fact that the voltages across the capacitors have a triangular shape which should involve a low electromagnetic interference, this interference is high enough that the falling edges have a rather high slope (the shape is more correctly termed "saw tooth") as shown in FIG. 4 of this article.

Of course this circuit is very sensitive to the symmetry of its components.

The purpose of the present invention is to supply a method of generating an oscillating electric signal and an associated oscillating circuit overcoming the shortcomings of the prior art.

SUMMARY OF THE INVENTION

According to a preferred embodiment of the present invention, there is provided an oscillator circuit whose oscillating frequency is substantially independent of a supply voltage, temperature and fabrication process. The oscillator circuit includes a capacitor, charge circuit and control circuit. The charge circuit includes a switch connected to the capacitor, and two current generators that generate current values which are opposite in direction. The switch alternately connects one or the other current generator to the capacitor to charge and discharge the capacitor. The control circuit has a voltage input connected to the capacitor and an output connected to an input of the switch. The control circuit has a comparator having a lower threshold voltage value and an upper threshold voltage value in which the difference between the upper and lower threshold voltage values is substantially proportional to the ratio of the product of the two current values to the sum of the two current values.

By using a single capacitor charged and discharged by two current generators and causing the voltage at its ends to have a truly triangular shape and an amplitude corresponding substantially to the ratio of the product to the sum of the two current values, the oscillation frequency and duty cycle are substantially independent of the supply voltage, temperature and fabrication process.

In accordance with another aspect the present invention relates also to an integrated circuit in which the oscillating circuit finds advantageous application.

BRIEF DESCRIPTION OF THE DRAWINGS

The present invention is clarified by the description given below examined together with the annexed drawings in which.

DETAILED DESCRIPTION OF THE INVENTION

Figure 1:
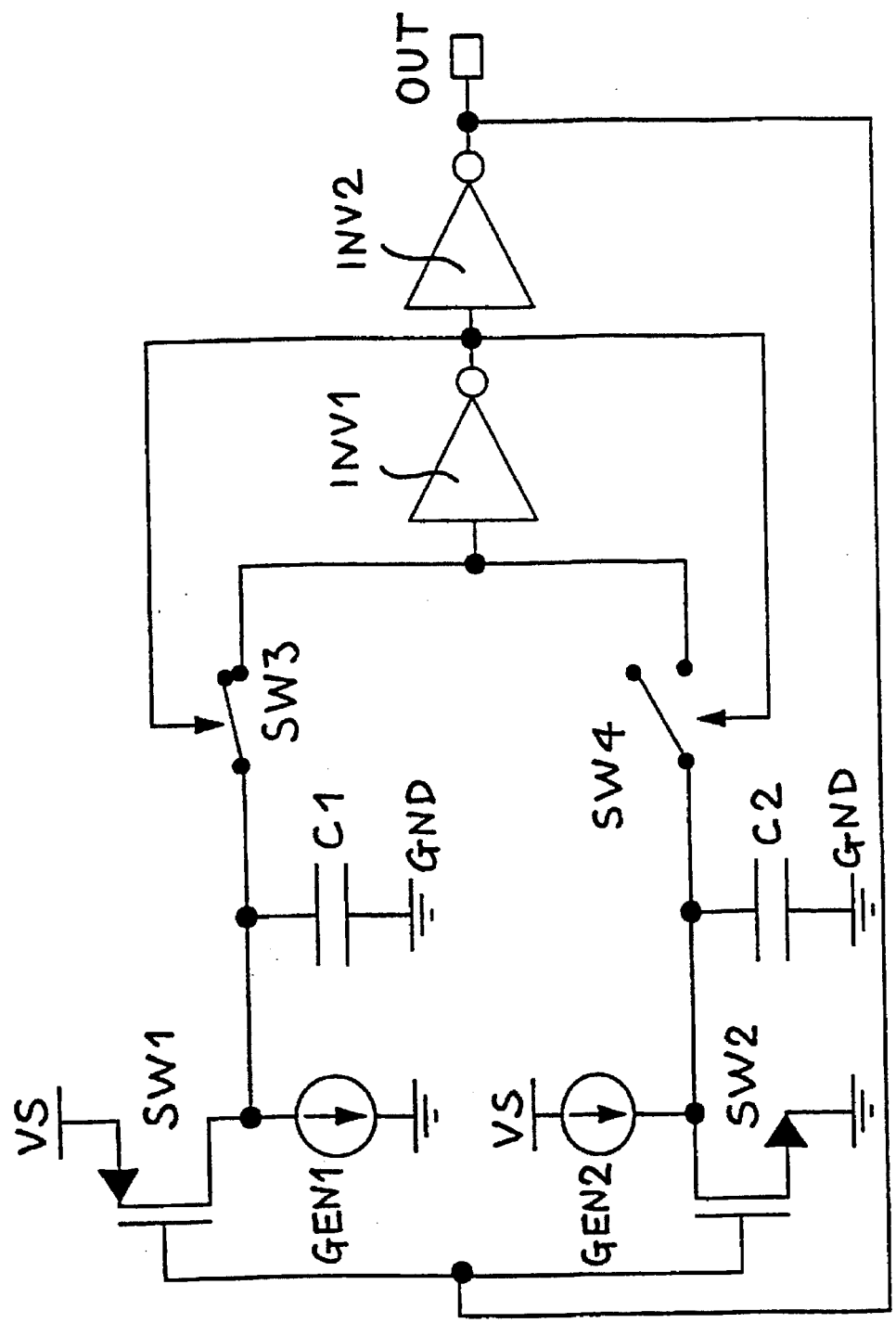
FIG. 1 shows a simplified circuit diagram of an oscillating circuit in accordance with the prior art.
Figure 2:
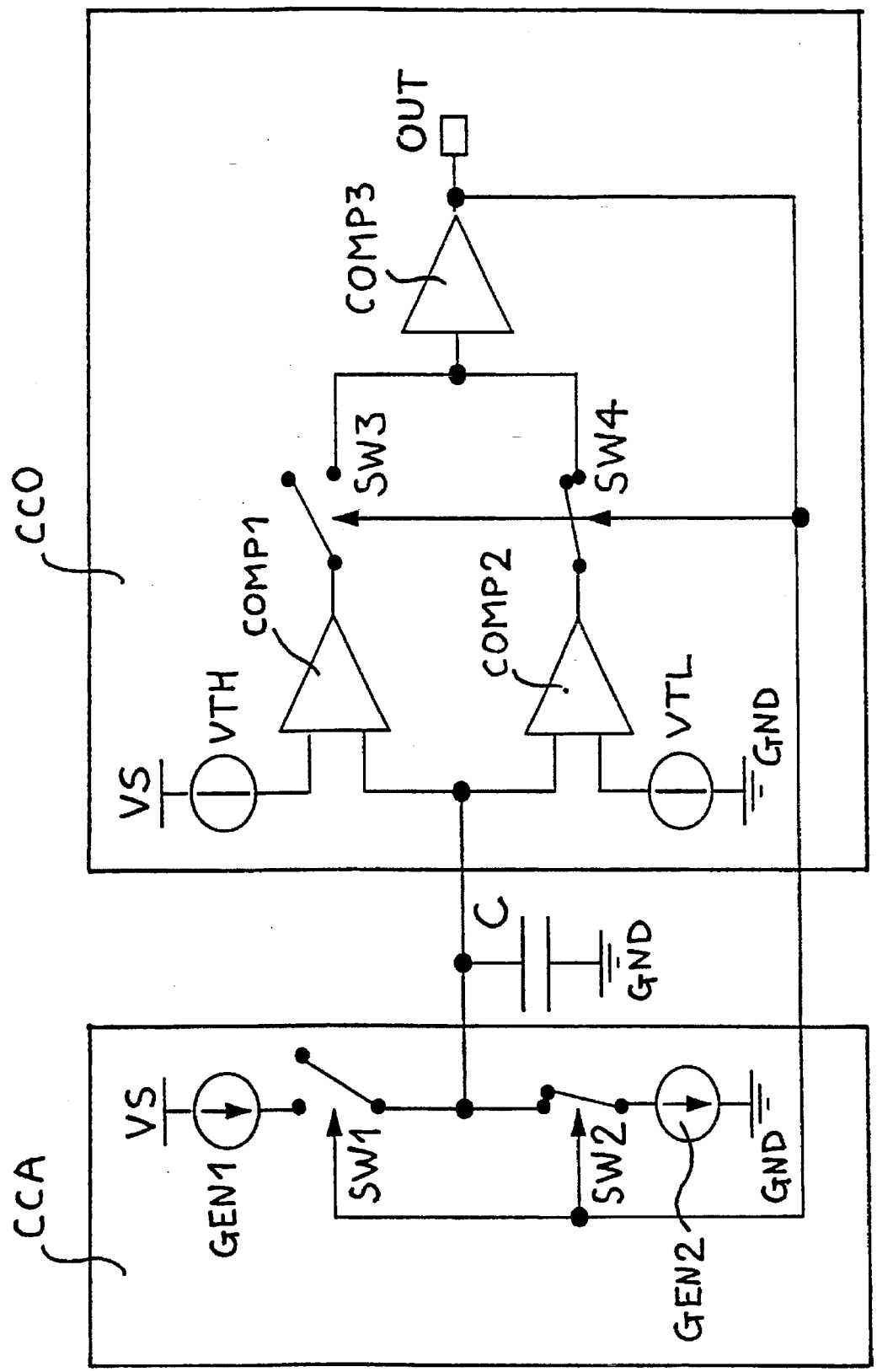
FIG. 2 shows a simplified circuit diagram of an oscillating circuit in accordance with the present invention.

With reference to FIG. 2 the oscillating circuit comprises a capacitor C, a charge circuitry CCA and a control circuitry CCO.

The charge circuitry CCA comprises a first current generator GEN1 and a second current generator GEN2 having respectively a first and a second current value and opposite directions (meaning that one is capable of supplying current at the output of the circuitry CCA and the other of absorbing it) and switching means corresponding to a first switch SW1 and a second switch SW2 designed to alternately couple the generators GEN1 and GEN2 to the capacitor C.

The control circuitry CCO has a voltage input coupled to the capacitor C and has an output coupled to control inputs of the switches SW1, SW2. The control circuitry CCO includes a comparator with hysteresis having a lower threshold and an upper threshold.

Preferably, the difference between the upper threshold and the lower threshold is chosen to be equal to a value which is proportional to the ratio of the product to the sum of the two current values or is approximately proportional to such a ratio.

The circuit is powered in the example of FIG. 2 by means of connection to a ground terminal GND and to a power supply terminal VS. It is also possible to use positive and negative power supply sources.

There are various points of this circuit at which is present an oscillating signal which could be used as an output, for example the voltage across the capacitor C. It is advantageous to connect the output OUT of the circuit to the output of the comparator with hysteresis CCO, i.e., to the output of the circuitry CCO and indeed this will have a shape substantially corresponding to a square wave and in general will not necessitate bufferization since the output impedance of a comparator is relatively low.

If the two current values are substantially equal, implementation of the circuit is much simpler.

If the generators GEN1, GEN2 are mutually interlocked, operation of the circuit is steadier and independent of process and temperature changes.

In FIG. 2 the circuitry CCO has one input and one output and includes two comparators COMP1 and COMP2, an inverter COMP3, two controlled switches SW3, SW4, a first voltage generator VTH and a second voltage generator VTL.

The generator VTH is connected to the power supply terminal VS in such a manner that a first reference potential thus generated corresponds to the upper threshold (which is lower than the supply voltage). The generator VTL is connected to the ground terminal GND in such a manner that a second reference potential thus generated corresponds to the lower threshold (which is higher than zero).

The input of the circuitry CCO is connected to a first input of the comparator COMP1 while the first reference potential is supplied to a second input of the comparator COMP1. The input of the circuitry CCO is connected to a first input of the comparator COMP2 while the second reference potential is supplied to a second input of the comparator COMP2. The comparators COMP1 and COMP2 are such as to supply at output a "high" logical signal when the potential at their first input is higher than the potential at their second input and vice versa.

The input of the inverter COMP3 is connected to the outputs of the comparators COMP1 and COMP2 respectively through the switches SW3 and SW4. The latter have control terminals connected together and are such that when one of the two is open the other is closed and vice versa. The output of the inverter COMP3 is connected to the control terminals of the switches SW3, SW4. When the output is in "high" logic state the switch SW3 is closed and the switch SW4 is open and hence the output of the comparator COMP1 is connected to the input of the inverter COMP3 and when the output is in "low" logic state the switch SW3 is open and the switch SW4 is closed hence the output of the comparator COMP2 is connected to the input of the inverter COMP3. Furthermore the output of the inverter COMP3 is connected to the output of the circuitry CCO.

It is natural that both the comparators and the inverter have a small intrinsic delay.

The above described circuit possesses two operational conditions, i.e., the first operational condition corresponds to the injection into the capacitor C of the current supplied by the generator GEN1 and the second operational condition corresponds to the extraction from the capacitor C of the current absorbed by the generator GEN2.

The circuitry CCO is designed to activate alternately the first or second operational condition depending on whether the voltage across the capacitor C has passed the lower threshold while decreasing or the upper threshold while increasing respectively.

It is advantageous that the switches SW1, SW2 be designed to couple alternately the first generator GEN1 and the second generator GEN2 at constant potential nodes respectively through a first and a second paths. Indeed, in this manner the two generators are never turned off and back on since these switching operations are generally slow and can give rise to transients that will negatively influence the circuit performance.

The oscillation frequency of the circuit of FIG. 2 is given by $$f = \frac{1}{\frac{DV \cdot C}{I1} + \frac{DV \cdot C}{I2}} = \frac{I1 \cdot I2}{DV \cdot C \cdot (I1 + I2)}$$

where DV indicates the voltage range across the capacitor C, C the capacitance of the capacitor, and I1 and I2 the current respectively of the generator GEN1 and generator GEN2.

From this formula it is clear that if DV is proportional to the ratio of the product to the sum of the two values I1 and I2, the frequency depends only on the value C and the proportionality factor.

Figure 3:
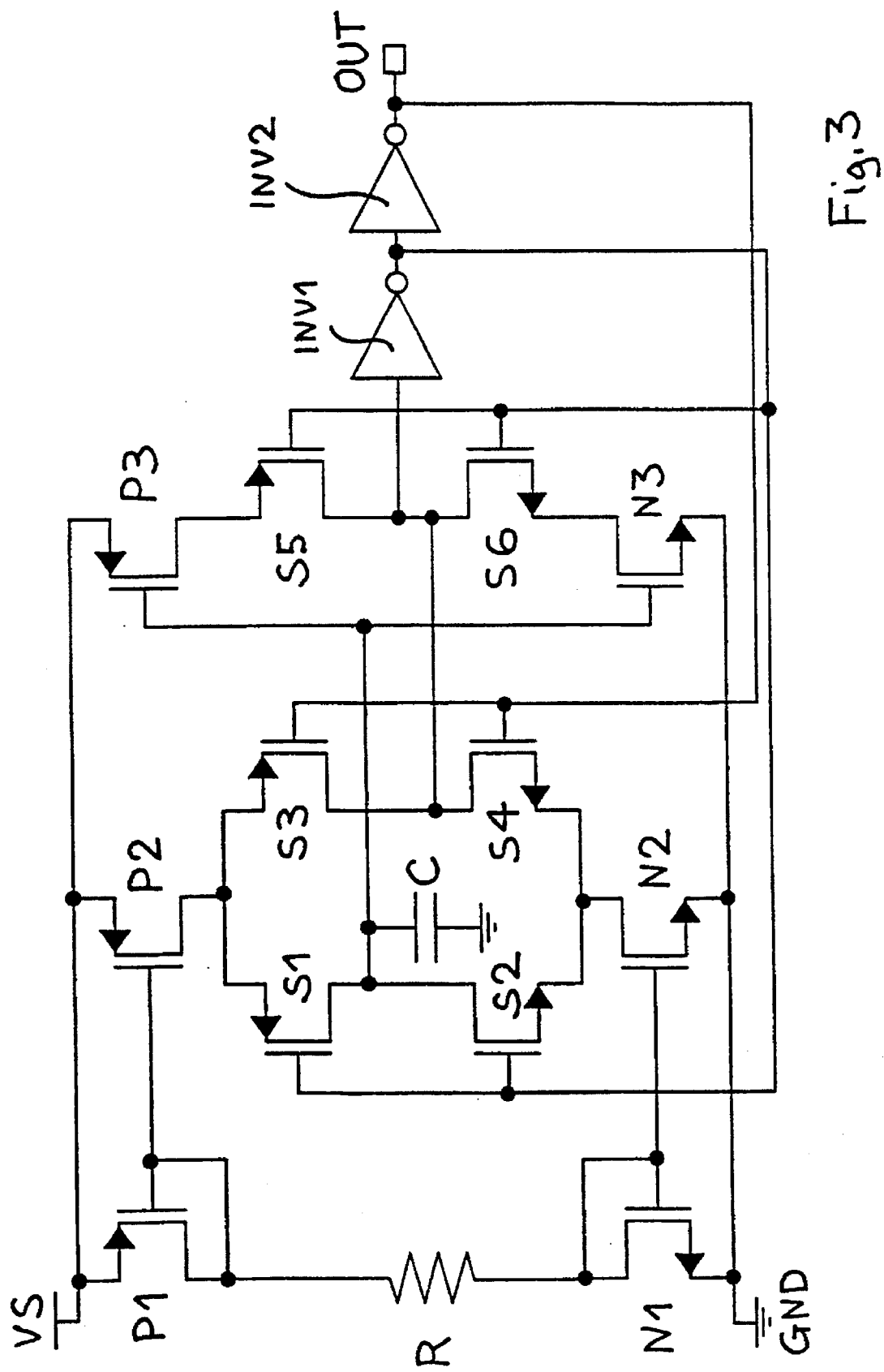
FIG. 3 shows a circuit diagram of one embodiment of the circuit of FIG. 2.

The circuit of FIG. 3 is a circuit diagram of one embodiment representative of the circuit of FIG. 2.

The current generators GEN1 and GEN2 are made up respectively of the p-channel transistor P2 and n-channel transistor N2. Their source terminals are respectively connected to the power supply terminal VS and to the ground terminal GND. The drain terminals constitute the respective outputs. The control terminals are connected together through an electrical network which interlocks them mutually.

This network includes a p-channel transistor P1, an n-channel transistor N1 and a resistor R. The transistor P1 is diode-connected and has its source terminal connected to the terminal VS and its control terminal connected to the control terminal of the transistor P2. The transistor N1 is diode-connected and has its source terminal connected to the terminal GND and its control terminal connected to the control terminal of the transistor N2. The resistor R is connected between the drain terminals of the transistors P1 and N1.

If the area ratios between the transistors P1 and P2 and between N1 and N2 are the same and equal to 1:1 the currents I1 and I2 generated by the two generators GEN1 and GEN2 will have the same value equal to:

$$I = \frac{VS - VGS(P2) - VGS(N2) - Vgnd}{R}$$

where it is necessary to allow for the fact that the VGS of the transistors P2 and N2 depends on the bias current which in this case corresponds to I since the pairs P1, P2 and N1, N2 behave as current mirrors.

The switch SW1 consists of two p-channel transistors S1 and S3 having their source terminals connected to the drain terminal of the transistor P2. The switch SW2 consists of two n-channel transistors S2 and S4 having their source terminals connected to the drain terminal of the transistor N2. The drain terminals of the transistors S1 and S2 are connected together to a first terminal of the capacitor C. The drain terminals of the transistors S3 and S4 are connected together. The control terminals of the transistors S1 and S2 are connected together. The control terminals of the transistors S3 and S4 are connected together. The second terminal of the capacitor C is connected to the ground terminal GND (it could also be connected to another reference potential).

The group formed by the comparator COMP1 and the generator VTH is implemented by means of a p-channel transistor P3 and the switch SW3 is implemented by means of a p-channel transistor S5. The source terminal of the transistor P3 is connected to the terminal VS and the source terminal of the transistor S5 is connected to the drain terminal of the transistor P3.

The group made up of the comparator COMP2 and the generator VTL is implemented by means of an n-channel transistor N3 and the switch SW4 is implemented by means of an n-channel transistor S6. The source terminal of the transistor N3 is connected to the terminal GND and the source terminal of the transistor S6 is connected to the drain terminal of the transistor N3.

The control terminals of the transistors N3 and P3 are connected together to the first terminal of the capacitor C. The control terminals of the transistors S5 and S6 are connected together.

The drain terminals of the transistors S5 and S6 are connected together to the drain terminals of the transistors S3 and S4 and to the input of a first inverter INV1 whose output is connected to the input of a second inverter INV2.

The outputs of the inverters INV1 and INV2 correspond to the output of the circuitry CCO. In the example of FIG. 3 the output OUT of the oscillator has been connected to the output of the inverter INV2.

The output of the inverter INV1 drives the control terminals of the transistors S1, S2, S5, S6. The output of the inverter INV2 drives the control terminals of the transistors S3 and S4.

The transistors N3 and P3 operate as comparators and specifically compare the voltage across the capacitor C respectively with the threshold voltage of the transistor N3 relative to ground (lower threshold) and the difference between the supply voltage and the threshold voltage of the transistor P3 (upper threshold). These threshold voltages mentioned are not however the intrinsic ones of the transistors but are the voltages VGS of those transistors at the bias current, i.e., VGS(N3) and VGS(P3).

If the transistors P2 and P3 are equal and the transistors N2 and N3 are equal, then VGS(N2)=VGS(N3) and VGS(P2)=VGS(P3), the currents being equal, and the oscillation frequency will be equal to 1/RC independent of process, temperature and supply voltage.

The duty cycle of the oscillation is 50% and depends only on the area ratios of the transistors N1, N2, N3, P1, P2, P3.

The electromagnetic interference is reduced to the minimum because the voltage across the capacitor C has an "actually" triangular shape and furthermore the edges of the triangle are slightly rounded.

The circuit of FIG. 3 achieves equality of the VGS in a particularly advantageous manner.

When the transistor S2 conducts, the current generated by the transistor N2 discharges the capacitor C and at the same time the transistors S1 and S4 do not conduct while the transistor S3 conducts and causes the current generated by the transistor P2 to run through the main conduction paths of the transistors N3 and S6 which are thus biased.

When the transistor S1 conducts, the current generated by the transistor P2 charges the capacitor C and at the same time the transistors S2 and S3 do not conduct while the transistor S4 conducts and causes the current generated by the transistor N2 to run through the main conduction paths of the transistors P3 and S5 which are thus biased.

The transistors S1 and S2 act as an inverter having an output connected to the capacitor C. When the gates of the inverter S1 and S2 are at logic low, the inverter connects the current generator P2 to the capacitor C thereby charging the capacitor. Conversely, when the gates of the inverter S1 and S2 are at logic high, the inverter connects the current generator N2 to the capacitor C thereby discharging the capacitor. If the transistors P2 and P3 are equal and the transistors N2 and N3 are equal, all four of these transistors are traversed by the same bias current and thus have the same VGS. This is achieved by an extremely simple circuitry and furthermore energy dispersal is minimized since the current of the generator not used at a predetermined time for charge/discharge of the capacitor C is used for biasing the transistor which must make the comparison with the threshold involved.

The comparison for example with the lower threshold takes place in the following manner. Assuming that the capacitor is found at a voltage corresponding for example to one-half of the supply voltage, the transistor N2 extracts its current through the transistor S2 from the capacitor C and then the voltage at its ends falls and simultaneously the transistor P2 keeps the transistor N3 biased through the transistors S3 and S6. As the voltage VGS of the transistor N3 falls its voltage VDS rises slowly since the current ID remains steady and this continues until saturation conditions of the transistor N3 are neared. Once saturation conditions are reached a minimal decrease in the VGS involves a high increase in the VDS of the transistor N3 which leads to switching of the inverter INV1 first and then the inverter INV2.

It is not simple to determine with accuracy the value of the VGS for switching of the transistors N3 and P3 nor therefore of the lower and upper thresholds because these transistors operate at the border between the saturation region and the linear region and hence the models and formulas normally used in the two regions are applicable only in a first approximation. But this is not very important for the purposes of operation of the circuit.

The present invention finds advantageous application in integrated circuits of the type which can be powered at low voltage (for example 3V). In these circuits it is often necessary to generate higher supply voltages. This is done by means of voltage boosting circuits with charge pump. These booster circuits require an oscillating electric signal at the input.

In the above-mentioned article of S. Hobrecht there is shown for example in FIG. 5 and described on pages 1397 and 1398 a voltage tripling circuit necessary for driving the control terminal of an MOS power transistor.

As mentioned above the present invention finds application in integrated circuits even for other purposes such as, for example, the generation of clock signals or programmable delays.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. An oscillating circuit comprising:
   a capacitor;

a charge circuit including
 a switch connected to the capacitor; and
 first and second current generators connected to the switch and outputting respectively first and second current values, the switch being operable to alternately connect the first and second generators to the capacitor; and
a control circuit having a voltage input connected to the capacitor and an output connected to an input of the switch, the control circuit including a comparator having a lower threshold voltage value and an upper threshold voltage value wherein the difference between the upper and lower threshold voltage values is substantially proportional to the ratio of the product of the first and second current values to the sum of the first and second current values.

2. The oscillating circuit according to claim 1 wherein the first and second current values are substantially equal in magnitude but opposite in direction.

3. The oscillating circuit according to claim 1, further including:
 an electrical network connected to the first and second current generators operable to mutually interlock the first and second current generators with respect to each other.

4. The oscillating circuit according to claim 1 wherein the switch includes an inverter connected between the first and second current generators.

5. The oscillating circuit according to claim 1 wherein the comparator includes:
 a first transistor having a control input connected to the capacitor wherein the upper threshold voltage value depends on the gate to source threshold value of the first transistor; and
 a second transistor having a control input connected to the capacitor wherein the lower threshold voltage value depends on the gate to source threshold value of the second transistor.

6. A method of generating an oscillating signal comprising the steps of:
 repeating the following steps to generate the oscillating signal:
  charging a capacitor with a first current value when the voltage across the capacitor decreases below a lower threshold voltage value; and
  discharging the capacitor with a second current value when the voltage across the capacitor increases above an upper threshold voltage value;
 wherein the difference between the upper and lower threshold voltage values is substantially proportional to the ratio of the product of the first and second current values to the sum of the first and second current values.

7. The method according to claim 6 wherein the step of charging a capacitor with a first current value includes the steps of:
 comparing the voltage across the capacitor with the lower threshold voltage value;
 generating a first signal when the voltage across the capacitor decreases below the lower threshold voltage value; and
 connecting a first current generator generating the first current value to the capacitor in response to the first signal.

8. The method according to claim 6 wherein the step of discharging the capacitor with a second current value includes the steps of:

comparing the voltage across the capacitor with the upper threshold voltage value;
generating a second signal when the voltage across the capacitor increases above the upper threshold voltage value; and
connecting a second current generator generating the second current value to the capacitor in response to the second signal.

9. The oscillating circuit according to claim 6 wherein the first and second current values are substantially equal in magnitude but are opposite in direction.

10. Method for generating an oscillating electric signal through an electric circuit comprising a capacitor, a charge circuitry and a control circuitry and in which said charge circuitry possesses at least first and second operational conditions and said first operational condition corresponds to the injection in said capacitor of a current having a first value and said second operational condition corresponds to the extraction from said capacitor of a current having a second value, the method comprising the step of:
 causing said control circuitry to activate alternately said first or said second operational condition depending on whether the voltage across said capacitor has passed a lower threshold while decreasing or an upper threshold while increasing respectively with the difference between said upper threshold and said lower threshold having a value substantially proportional to the ratio of the product of said first and second values to the sum of said first and second values so that said oscillating electric signal corresponds to the voltage across said capacitor.

11. Method in accordance with claim 10 wherein said oscillating electric signal corresponds to a voltage signal obtained by substantially squaring the voltage across said capacitor.

12. Method in accordance with claim 10 wherein said first and second values are substantially equal.

13. Method in accordance with claim 10 wherein said first and second operational conditions are achieved by connecting to said capacitor respectively first and second current generators mutually interlocked.

14. Method in accordance with claim 13 wherein in said first operational condition said first generator is coupled to said capacitor and said second generator is coupled through a second path to a constant potential node and in said second operational condition said second generator is coupled to said capacitor and said first generator is coupled through a first path to a constant potential node.

15. Method in accordance with claim 13 wherein said first and second generators respectively use first and second threshold devices as output devices in such a manner that said first and second values depend on the sum of the thresholds of said first and second devices and wherein said control circuitry uses third and fourth threshold devices which are respectively and substantially equal to said first and second threshold devices in such a manner that said upper threshold depends on the threshold of said third device and said lower threshold depends on the threshold of said fourth device.

16. Method in accordance with claim 14 wherein said first path is such as to include the main conduction path of said fourth device and wherein said second path is such as to include the main conduction path of said third device.

17. Oscillating circuit comprising:
 a capacitor, a charge circuitry and a control circuitry and characterized in that said charge circuitry includes first and second current generators having respectively first and second current values with opposite directions from each other and switching means designed to couple alternately said generators to said capacitor and in that said control circuitry has a voltage input coupled to said capacitor and an output coupled to control inputs of said switching means and includes a comparator with hysteresis having a lower threshold and an upper threshold and in that the difference between said upper threshold and said lower threshold has a value substantially proportional to the ratio of the product of said first and second values to the sum of said first and second values.

18. Circuit in accordance with claim 17 wherein the output of said oscillating circuit is coupled to the output of said comparator with hysteresis.

19. Circuit in accordance with claim 17 wherein said first and second values are substantially equal.

20. Circuit in accordance with claim 17 wherein said generators are mutually interlocked by means of an electrical network.

21. Circuit in accordance with claim 17 wherein said switching means are designed to couple alternately said first and second generators to constant potential nodes respectively through a first and a second path.

22. Circuit in accordance with claim 17 wherein said first and second generators comprise respectively first and second threshold devices as output devices and in that said first and second values depend on the sum of the thresholds of said first and second devices and in that said control circuitry includes third and fourth threshold devices which are respectively and substantially equal to said first and second devices and in that said upper threshold depends on the threshold of said third device and said lower threshold depends on the threshold of said fourth device.

23. Circuit in accordance with claim 22 wherein said first path includes the main conduction path of said fourth device and in that said second path includes the main conduction path of said third device.

24. Integrated circuit of the type which can be powered with low voltage and comprising a voltage boosting circuit with charge pump and an oscillating circuit in accordance with claim 17 connected to the input of said boosting circuit.

* * * * *